(12) United States Patent
Hekmatshoartabari et al.

(10) Patent No.: US 9,666,615 B2
(45) Date of Patent: May 30, 2017

(54) SEMICONDUCTOR ON INSULATOR SUBSTRATE WITH BACK BIAS

(71) Applicant: International Business Machines Corporation, Armonk, NY (US)

(72) Inventors: Bahman Hekmatshoartabari, White Plains, NY (US); Ali Khakifirooz, Los Altos, CA (US); Ghavam G. Shahidi, Pound Ridge, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/918,537

(22) Filed: Oct. 20, 2015

(65) Prior Publication Data

US 2017/0110491 A1      Apr. 20, 2017

(51) Int. Cl.
| H01L 21/84 | (2006.01) |
| H01L 27/13 | (2006.01) |
| H01L 27/12 | (2006.01) |

(52) U.S. Cl.
CPC ............. *H01L 27/13* (2013.01); *H01L 21/84* (2013.01); *H01L 27/1207* (2013.01)

(58) Field of Classification Search
CPC ...... H01L 21/84; H01L 27/13; H01L 27/1207
See application file for complete search history.

(56) References Cited

U.S. PATENT DOCUMENTS

| 5,374,564 | A | 12/1994 | Bruel |
| 8,044,399 | B2 | 10/2011 | Hino |
| 8,119,462 | B2 | 2/2012 | Takasawa |
| 8,247,261 | B2 | 8/2012 | Bedell |
| 8,877,548 | B2 | 11/2014 | Veerasamy |
| 2011/0033688 | A1 | 2/2011 | Veerasamy |
| 2012/0064649 | A1 | 3/2012 | He |
| 2012/0228689 | A1 | 9/2012 | Daval |

(Continued)

FOREIGN PATENT DOCUMENTS

| JP | 11-11980 | 1/1991 |
| JP | 05226075 A | 9/1993 |

(Continued)

OTHER PUBLICATIONS

Dawson-Elli, D.F. et al, Demonstration of High Performance TFTs on Silicon-on Glass (SiOG) Substrate, SID Symposium Digest of Technical Papers, Jul. 2007. pp. 1-7.

*Primary Examiner* — Whitney T Moore
*Assistant Examiner* — Joseph Galvin, III
(74) *Attorney, Agent, or Firm* — Louis J. Percello; Otterstedt, Ellenbogen & Kammer, LLP

(57) ABSTRACT

A semiconductor on insulator substrate includes an electrically conductive layer disposed between an electrically insulating handle layer and the semiconductor layer to facilitate the application of a back bias. The connection of the electrically conductive layer to a reference voltage reduces the effects of trapped or fixed charges associated with the handle layer on the threshold voltage of a transistor formed on the semiconductor layer. Silicon-based devices formed on glass, plastic, and quartz substrates are among the devices that can benefit from the application of a back bias.

20 Claims, 4 Drawing Sheets

(56) References Cited

U.S. PATENT DOCUMENTS

| | | | |
|---|---|---|---|
| 2012/0299105 A1* | 11/2012 | Cai | H01L 27/1203 |
| | | | 257/348 |
| 2013/0089968 A1 | 4/2013 | Usenko | |
| 2013/0180564 A1* | 7/2013 | Hekmatshoartabari | ................... |
| | | | H01L 31/075 |
| | | | 136/244 |
| 2013/0306971 A1* | 11/2013 | Bedell | H01L 21/84 |
| | | | 257/59 |
| 2013/0307075 A1* | 11/2013 | Hekmatshoar-Tabari | ................. |
| | | | H01L 29/78654 |
| | | | 257/347 |
| 2014/0103436 A1 | 4/2014 | Bedell | |
| 2014/0191237 A1 | 7/2014 | Hekmatshoartabari | |

FOREIGN PATENT DOCUMENTS

| | | | |
|---|---|---|---|
| JP | 5656212 B2 | 7/2011 | |
| JP | 5731502 B2 | 1/2013 | |
| WO | WO 2014/191708 A1 | 12/2014 | |

* cited by examiner

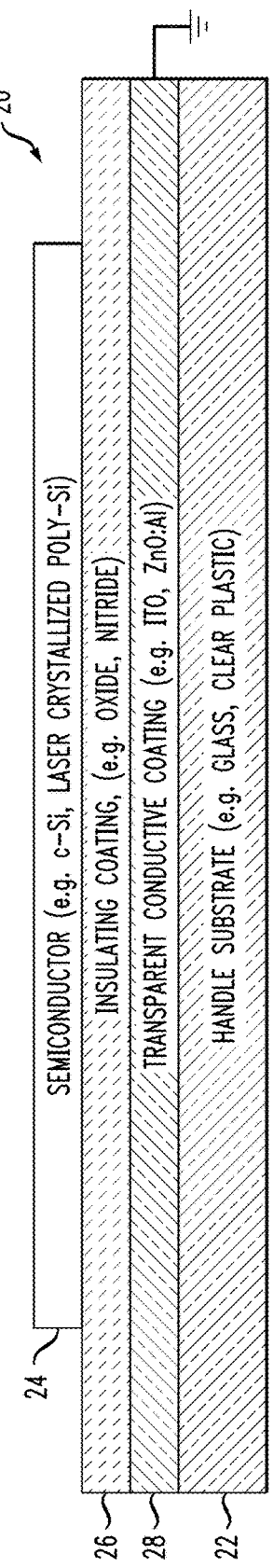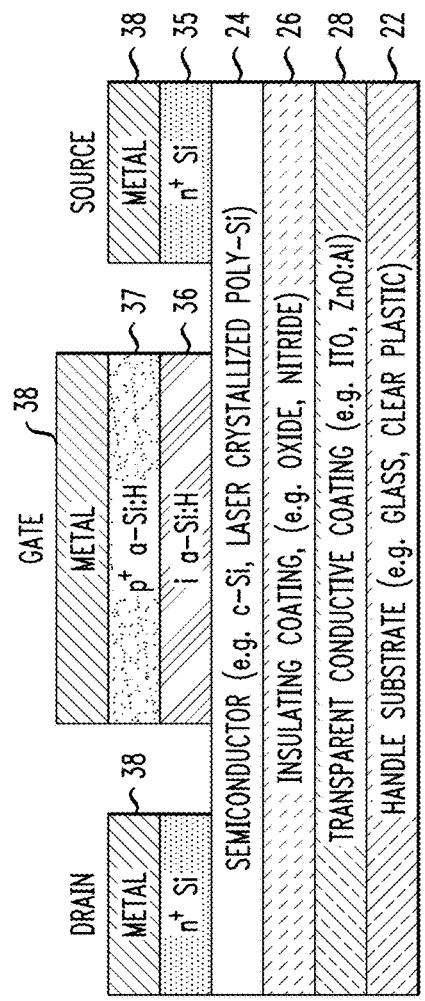

SEMICONDUCTOR ON INSULATOR SUBSTRATE WITH BACK BIAS

BACKGROUND

The present disclosure relates generally to the electrical, electronic and computer arts and, more particularly, to substrates that facilitate application of a back bias and devices formed using such substrates.

Various methods of fabricating semiconductor-on-insulator substrates such as silicon-on-insulator (SOI) substrates are known, one of which is Separation-by-Implanted Oxygen (SIMOX), wherein oxygen is ion implanted into a single crystal silicon substrate to form a BOX film. Another method of forming an SOI substrate is through the SMART CUT® method and wafer bonding, wherein two semiconductor substrates with silicon oxide surface layers are bonded together at the silicon oxide surfaces to form a BOX layer between the two semiconductor substrates. Doping of SOI substrates can be adjusted during fabrication. Semiconductor substrates such as silicon-on-insulator are commercially available.

The use of SOI substrates without a back gate bias may cause threshold voltage instabilities due to the accumulation of charge from environmental or other sources. This issue may be avoided by applying a bias to the handle substrate, which is comprised of silicon. The application of a back bias may also be used to adjust the threshold voltage of transistors formed on the substrate. Multiple threshold voltage ($V_t$) devices can be obtained on a single chip by applying different back biases.

Various silicon on transparent, electrically insulating substrates have been developed. Such substrates have potential application to display/pico-projector technologies, for example in mobile applications. Silicon-on-glass (SiOG), silicon on plastic, silicon-on sapphire (SOS) and silicon on quartz (SOQ) are among the electrically insulating substrates that are being used to develop electronic devices. Semiconductor materials other than silicon can alternatively be provided on such substrates. CMOS fabrication techniques have been applied in the fabrication of devices using silicon substrates and some transparent, electrically insulating substrates such as SiOG substrates.

BRIEF SUMMARY

Techniques are provided for forming semiconductor substrates that prevent unwanted shifts in the threshold voltages of transistors formed thereon.

In one aspect, an exemplary method of fabricating an electronic device includes obtaining a substrate including an electrically insulating handle layer, a semiconductor layer, an electrically insulating layer between the semiconductor layer and the handle layer, and an electrically conductive layer between the handle layer and the electrically insulating layer. The electrically conductive layer directly contacts the electrically insulating layer. A field-effect transistor is formed on the semiconductor layer. An electrical connection is formed between the electrically conductive layer and a reference voltage for reducing effects of electrical charges on the field-effect transistor.

In a further aspect, an exemplary semiconductor device includes a substrate including an electrically insulating handle layer, a semiconductor layer, an electrically insulating layer between the semiconductor layer and the handle layer, and an electrically conductive layer between the handle layer and the electrically insulating layer. The electrically conductive layer directly contacts the electrically insulating layer. A field-effect transistor is on the semiconductor layer. The device further includes an electrical connection between the electrically conductive layer and a reference voltage operative to reduce effects of electrical charges originating with the handle layer on the field-effect transistor.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

- Reducing the effects of trapped or fixed charge associated with a handle substrate;
- Avoiding unwanted shifting of the voltage threshold of transistors formed on electrically insulating handle substrates;
- Facilitating use of transparent, electrically insulating substrates in the fabrication of CMOS devices;
- Facilitating adjustment of transistor threshold voltage.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 1 is a schematic, cross-sectional view depicting an exemplary substrate including an electrically insulating handle substrate;

FIG. 2 is a schematic, cross-sectional view depicting a heterojunction field-effect thin film transistor;

Figure 3A:
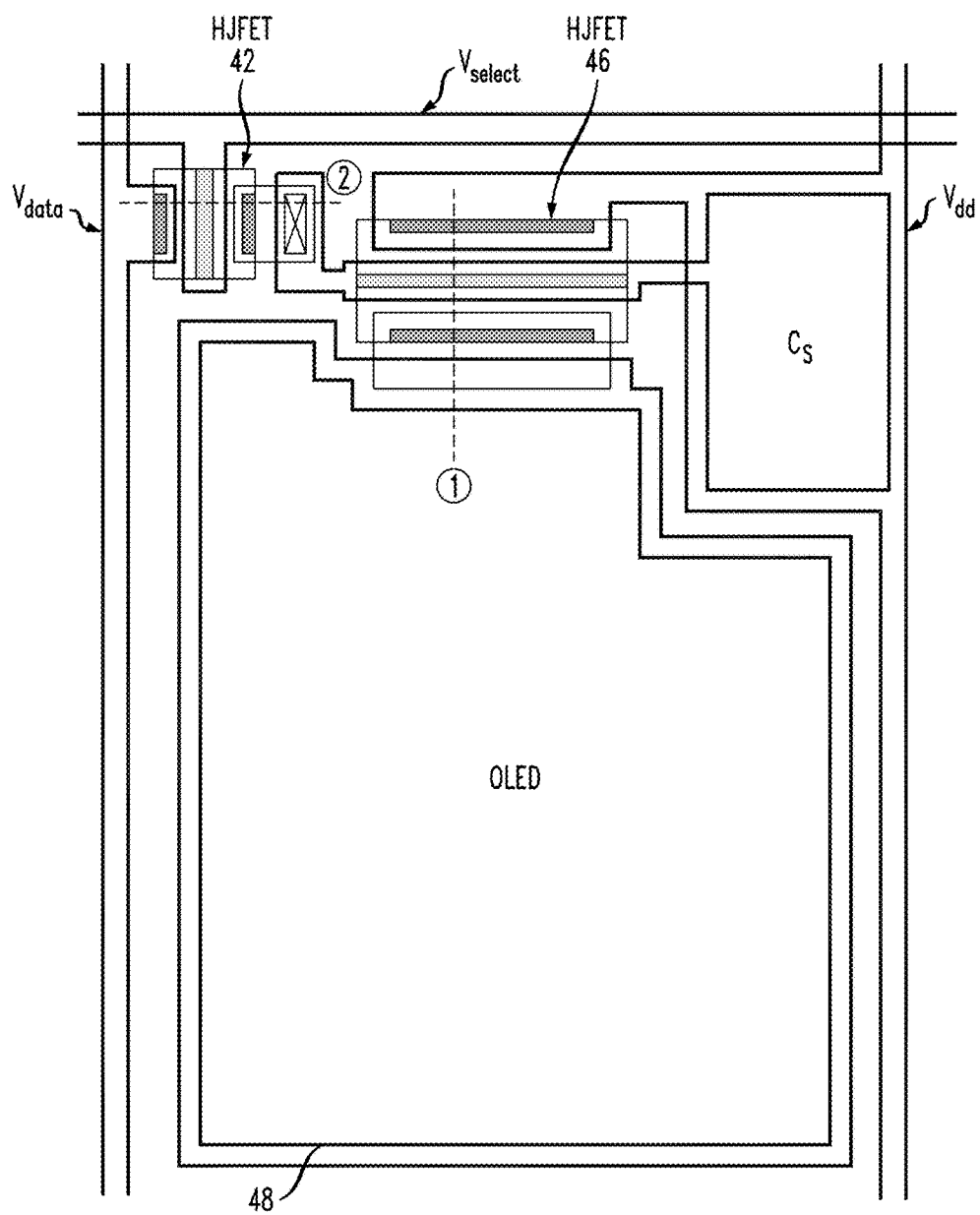
FIG. 3A is a schematic illustration of a pixel layout and FIG. 3B is an electrical schematic diagram including an exemplary pixel circuit corresponding to the pixel layout.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative backplanes that include heterojunction field-effect thin-film transistors on electrically insulating substrates. The transistors are formed using complementary metal-oxide-semiconductor (CMOS)-compatible processes. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments provide a semiconductor on insulator substrate is provided having an electrically conductive layer disposed between a handle substrate and a semiconductor layer to facilitate the application of a back bias. In one or more embodiments, the semiconductor on insulator substrate and devices formed thereon provide the following advantages:

enables back bias for devices on electrically insulating handle substrates;

allows either grounding to eliminate parasitic effects of electrostatic charges or connection to a reference voltage to adjust a transistor threshold voltage;

facilitates use of transparent, electrically insulating substrates in the fabrication of CMOS devices.

FIG. 1 is a cross-sectional view schematically depicting a portion of an exemplary substrate 20. The substrate 20 can be employed for fabricating electronic devices such as field-effect transistors (FETs). The substrate 20 includes an electrically insulating handle substrate 22, a semiconductor layer 24, and electrically insulating layer 26 and a transparent, electrically conductive layer 28. A glass handle substrate is employed in some embodiments. Clear plastic handle substrates are employed in other exemplary embodiments. The handle substrate may have a thickness in the range of about 1 μm to about 1 mm, though a thickness between 10-250 μm is preferred for some embodiments. Thinner or thicker handle substrates could be employed depending on a particular application. Glass or plastic-compatible CMOS processing techniques are employed to form electronic devices on the substrate 20 depending on the composition of the handle substrate.

The semiconductor layer 24 in some exemplary embodiments is a monocrystalline silicon layer that is either doped or essentially undoped. In some embodiments, the semiconductor layer further includes germanium or carbon atoms. The thickness of the semiconductor layer is less than two hundred nanometers in some embodiments, and is in the range of 2-30 nm in one or more embodiments. Polysilicon semiconductor layers can be employed in some alternative embodiments. Laser crystallized polysilicon can, for example, be employed for forming devices such as thin film transistors (TFTs). The semiconductor layer 24 can be patterned into electrically isolated active device regions on which the TFTs are formed. Active regions may each include one or more transistors.

The electrically insulating layer 26 includes one or more layers of a dielectric material such as silicon dioxide, silicon nitride, boron nitride, and combinations thereof. The thickness of at least one of the dielectric layer(s) comprising the electrically insulating layer can be from two nanometers to three microns (2 nm-3 μm), although greater and lesser thicknesses are possible. Relatively thin layers are desired if the substrate 20 is intended to be flexible.

The transparent, electrically conductive layer 28 is an indium tin oxide (ITO) layer in some embodiments. Aluminum-doped zinc oxide (AZO) is another material that may be used to form the electrically conductive layer 28. These materials should be considered exemplary and not limiting. An ITO layer may be deposited directly on the handle substrate 22 by a physical vapor deposition (PVD) process such as sputtering or electron beam deposition. The deposited indium tin oxide thin film layer includes about ninety percent indium oxide and about ten percent sin oxide ($SnO_2$) in one or more embodiments. The thickness of an exemplary ITO layer is between one thousand and three thousand angstroms in some embodiments, which allows it to function as a transparent electrical conductor when deposited on a glass or clear plastic handle substrate as disclosed herein. As used herein, the term "transparent" means substantial optical transparency to light in the visible spectrum, it being appreciated that some scattering is expected. The electrically conductive layer 28 is shown as electrically connected to ground in FIG. 1 for illustrative purposes. The formation of electrical connections to ground or to a reference voltage other than ground may occur later in the fabrication process and subsequent to the formation of electronic devices using the substrate 20. The electrically conductive layer 28 is formed as a conformal coating on the handle substrate 22 so that it completely covers the surface of the handle substrate. The active regions, on which electronic devices are formed, are accordingly formed only over the surface of the electrically conductive layer where they will not be materially affected by electric charges associated with the handle substrate 22. In other words, the active regions and associated electronic devices will not be aligned with exposed surface portions of the handle substrate that could, for example, affect the threshold voltage of transistors formed in the active region(s).

The substrate 20 may be formed using a combination of deposition processes and layer transfer techniques familiar to those in the art. As discussed above, the transparent, electrically conductive layer 28 is deposited directly on the electrically insulating handle substrate 22. In some embodiments, the electrically insulating layer 26 is deposited on the electrically conductive layer and the semiconductor layer 24 is then bonded to the electrically insulating layer 26. In other exemplary embodiments, the semiconductor layer 24 is first coated with the electrically insulating layer and the resulting structure is bonded to the electrically conductive layer 28. Layer transfer techniques that may be employed in the fabrication of the substrate include SMART CUT®, controlled spalling, and epitaxial layer lift-off (ELO). In one exemplary process, the handle substrate 22 is obtained and the electrically conductive layer 28 deposited thereon. A monocrystalline silicon substrate (not shown) such as a silicon wafer is obtained. Such wafers are commercially available. An electrically insulating layer is formed on a surface of the silicon substrate. The electrically insulating layer can be formed thermally or by deposition. In some embodiments, the electrically insulating layer is deposited on the silicon substrate using methods such as, but not limited to, CVD, plasma-enhanced CVD (PECVD), spin-on, and other applicable methods known by those skilled in the art for depositing oxide and nitride dielectric layers. Hydrogen is implanted within the wafer, forming a bubble layer within the silicon and parallel to the surface of the substrate. The implanted silicon substrate is brought into contact with the handle substrate such that the transparent, electrically conductive layer 28 adjoins the electrically insulating layer formed on the silicon substrate. Annealing of the resulting structure facilitates separation of the silicon substrate along the bubble layer, leaving a thin silicon layer on the electrically insulating layer. The thin silicon layer is subjected to chemical mechanical planarization (CMP) to form the semiconductor layer 24 depicted in FIG. 1. In one alternative embodiment, dielectric layers are formed on both the silicon substrate and the electrically conductive layer 28. The two dielectric layers directly contact each other when the silicon substrate and handle substrate are joined, and together form the electrically insulating layer 26 as shown in FIG. 1. In a further alternative embodiment, a dielectric layer to be used as the electrically insulating layer 26 is formed only on the transparent, electrically conducting layer 28 and not the silicon substrate. The semiconductor layer 24 obtained from the silicon substrate would then be bonded directly to the dielectric layer. In some embodiments, one or both bonding surfaces are treated with plasma (e.g. oxygen plasma or synthetic air plasma) prior to bonding in order to facilitate bonding at low temperatures, which may range from room-temperature to 400° C. In some embodiments, plasma-activated bonding is performed at 200° C. or below.

The substrate 20 as schematically illustrated in FIG. 1 may alternatively be obtained using a controlled spalling process performed prior to the bonding process. If controlled spalling is employed, the semiconductor substrate includes a stressor metal layer(s) (e.g. nickel), a flexible handle substrate such as a polyimide layer, and optionally an adhesive layer to improve adhesion of the stressor metal layer to the surface of the semiconductor substrate. The flexible handle substrate (e.g. polyimide) is then used for detaching a thin layer of semiconductor material such as silicon to be used as the semiconductor layer 24 by spalling through the silicon substrate. The thickness of the metal stressor layer is a factor in determining where the fracture will occur in the substrate. A strained layer beneath the surface of the semiconductor surface can be optionally provided to create a fracture plane to obtain a spalled semiconductor layer having a well-defined thickness and a relatively smooth fractured surface. The spalled semiconductor layer can be optionally subjected to CMP while adhered to the polyimide handle layer and bonded to the electrically insulating layer 26. Following bonding of the spalled semiconductor layer to the structure including the handle substrate 22, the polyimide layer and the metal stressor layer are removed and the surface of the spalled semiconductor layer is subjected to CMP. The residual semiconductor layer obtained from the semiconductor substrate and bonded to the electrically insulating layer 26 forms the semiconductor layer 24 of the substrate 20. In some embodiments, a dielectric layer is formed on the residual semiconductor layer prior to bonding it to the structure including the electrically insulating handle substrate 22. The dielectric layer formed on the residual semiconductor layer would then be bonded to one of the electrically conductive layer 26 or an electrically insulating layer formed thereon. Stress-induced substrate spalling is disclosed, for example, in U.S. Pat. No. 8,247,261, which is incorporated by reference herein.

In some embodiments, the semiconductor layer 24 is formed by direct deposition or a combination of deposition and post-deposition treatment including crystallization, instead of bonding. In these embodiments, the insulating coating 26 and the transparent conductive coating 28 may be deposited on the handle substrate 22 as explained above using techniques known in the art. In one example, the semiconductor layer 24 is formed by sputtering of non-hydrogenated amorphous Si onto the insulating coating layer 26, followed by laser crystallization to form poly-Si. In another example, the semiconductor layer 24 is formed by plasma-enhanced chemical vapor deposition (PECVD) of hydrogenated amorphous Si, followed by either an annealing step or a low-energy laser treatment step for dehydrogenation, and finally laser crystallization to form poly-Si. In another example, an amorphous Si layer is formed by spin coating or printing from a Si-containing ink, followed by optional curing, and finally laser crystallization to form poly-Si. In the above examples, other forms of crystallization known in the art, including metal-induced crystallization (MIC) or metal-induced lateral crystallization (MILC) may be employed as well, where the metal seed (blanket or patterned) is disposed at the top surface, bottom surface or within the semiconductor layer 24. In one example, semiconductor layer 24 is comprised of poly-crystalline Ge and deposited by chemical vapor deposition (CVD) (for example rapid thermal CVD) directly onto the insulating coating layer 26. In another example, semiconductor layer 24 is comprised of a metal-oxide semiconductor (amorphous or crystalline), deposited by techniques known in the art, such as sputtering.

A heterojunction field-effect thin-film transistor (HJFET) 30 is schematically illustrated in FIG. 2. The transistor 30 includes an electrically insulating handle 22 and an electrically conductive layer 28 on the handle. An electrically insulating layer 26 adjoins the electrically conductive layer 28. A crystalline silicon layer 24 directly contacts the electrically insulating layer 33. The structure can be formed using techniques described with respect to the substrate 20 described above.

Gate, drain and source regions are grown on the substrate 20 comprising layers 22, 24, 26, 28 using PECVD techniques at less than 200° C. In the exemplary embodiment, the source and drain regions include n+ silicon layers 35 and adjoining metal layers 38. The gate region includes an intrinsic amorphous hydrogenated silicon (i a-Si:H) 36, a p+ amorphous hydrogenated silicon 37 on the intrinsic amorphous hydrogenated silicon layer 36, and a metal layer 38 on the p+ amorphous hydrogenated silicon layer 37.

Figure 3B:
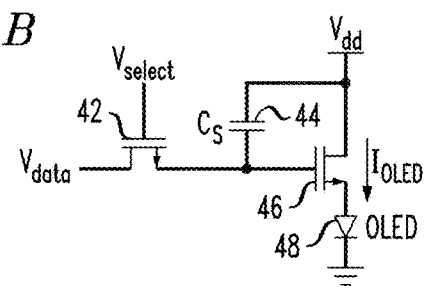

FIG. 3B shows an exemplary pixel circuit including a switching thin film transistor (TFT) 42, a storage capacitor 44, and a driver thin film transistor 46 operatively associated with an OLED 48. One TFT 42 is employed to start and stop charging of a storage capacitor while the other 46 functions as a current source to provide a constant current for each pixel. Each TFT is formed on an electrically insulating substrate and includes a back gate comprising a transparent, electrically conducting layer on the electrically insulating substrate that reduces or prevents threshold voltage instabilities. The storage capacitor 44 maintains a constant voltage on a charged pixel between refresh cycles. The frontplane of passive elements (OLEDs) is integrated, e.g. laminated, onto a backplane including an array of TFT elements to control current flowing to the passive elements. The select and data lines respectively transfer the switching and programming signals. The switching TFT 42 provides voltage to the gate of the driver TFT 46, which in turn drives the OLED 48. The OLED includes electroluminescent material disposed between plates or electrodes, one of the electrodes being electrically connected to ground. A power line includes a supply voltage $V_{dd}$ and provides current for operating the pixel.

Figure 4:
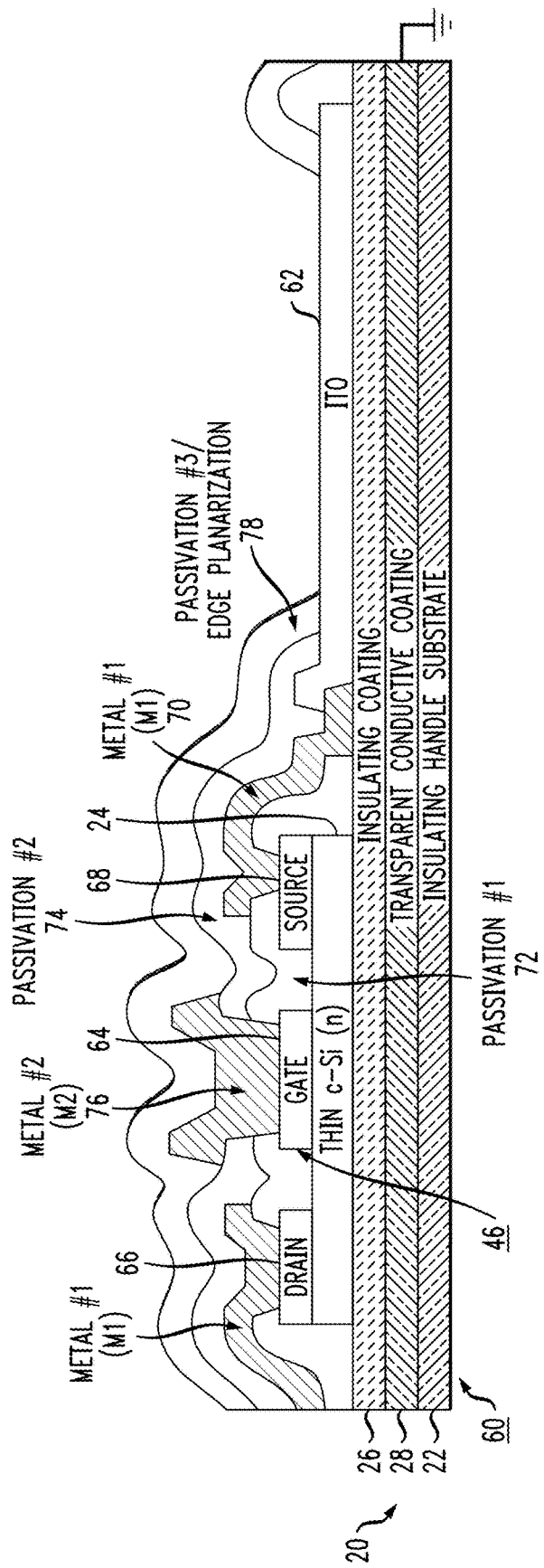
FIG. 4 is a schematic, cross-sectional view depicting an exemplary driver transistor.

FIG. 4 shows a portion 60 of a backplane structure including an exemplary embodiment of a driver TFT 46 formed on an n-doped, crystalline silicon layer 24 prior to OLED deposition. As used herein, the term "crystalline" refers to single-crystalline (mono-crystalline) and/or poly-crystalline (multi-crystalline). The term "n-type" refers to the addition of impurities that contribute free electrons to an intrinsic semiconductor. In a silicon containing substrate, examples of n-type dopants, i.e. impurities, include but are not limited to antimony, arsenic and phosphorous. The term "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium.

The exemplary backplane portion 60 includes heterojunction field-effect thin film transistors in some embodiments. It will be appreciated that the substrate 20 used to form the exemplary backplane may instead be used to form other types of thin film field-effect transistors in addition to or in place of heterojunction field-effect thin film transistors. Application of a back bias through the use of such a substrate facilitates the effective use of any field-effect transistor that would be adversely affected by electrical charges associated with the use of an electrically insulating handle substrate. In this exemplary embodiment, the HJFET TFT transistors 46 function as driver transistors for passive devices, such as the OLEDs 48, by providing current to an electrode 62 of the passive device. The electrode is comprised of a transparent conductive oxide (TCO) material in some embodiments such as ITO or AZO. The handle substrate 22 may be glass or clear plastic, as discussed above. The active devices are formed on the electrically insulating layer 26. The thin, doped (e.g. n-type) crystalline silicon layer 24 adjoins the electrically insulating layer 26. Gate, drain and source structures 64, 66, 68 are formed on the semiconductor layer 24. As discussed above, the silicon layer may be applied to the substrate 22 by a transfer process such as wafer bonding. An electrically insulating layer is formed on the semiconductor layer prior to such transfer in some embodiments. Alternatively, the semiconductor layer 24 may be form by deposition, followed by post-deposition treatment in some embodiments. In addition to silicon, semiconductor materials such as SiGe, Ge and III-V materials may alternatively be used to form the semiconductor layer 24. The semiconductor layer 24 is patterned to form electrically isolated active regions.

Deposition and patterning of the drain and source regions 66, 68 on the semiconductor layer 24 may be performed by depositing a doped semiconductor layer on the semiconductor layer 24, preferably using a low temperature deposition process. Examples of low temperature deposition processes include PECVD and hot wire CVD. The deposition temperature is maintained below 200° C. in some embodiments. The layer deposited on the semiconductor layer 24 may include single-crystal or polycrystalline silicon is some exemplary embodiments. Non-crystalline source and drain regions may alternatively be formed. The deposited layer may be doped or partially doped in situ or doped following deposition and patterning. Implantation and diffusion doping are two exemplary doping techniques that can be employed in place of or supplemental to in situ doping. In some embodiments, a silicon layer is selectively deposited on the semiconductor layer 24. Gas sources such as silane ($SiH_4$), disilane, dichlorosilane (DCS), tetrafluorosilane and combinations thereof may be employed using, for example, a plasma enhanced CVD process. In situ n-type doping may be provided by suing a phosphine ($PH_3$) gas source. In one exemplary embodiment, epitaxial growth of silicon on the semiconductor layer 24 is performed in a hydrogen diluted silane environment using PECVD. The gas ratio of hydrogen to silane ($[H_2]/[SiH_4]$) at 150° C. is between 0 to about 1,000, Epitaxial growth of silicon begins at a gas ratio of about 5-10. The epitaxial silicon quality is improved by increasing the hydrogen dilution to five or greater. Radio-frequency (RF) or direct current (DC) plasma enhanced chemical vapor deposition can be performed at deposition temperatures from about room temperature to about 400° C., and preferably from about 150-200° C. Plasma power density may range from about two $mW/cm^2$ to about 2,000 $mW/cm^2$. A deposition pressure range is about ten mTorr to about five Torr. After deposition, the deposited layer is patterned using lithographic masking and etching techniques to obtain the drain and source regions 66, 68. As discussed above, etching is further performed to pattern the semiconductor layer 24 and form active regions conforming to the dimensions of the TFTs to be formed. In some embodiments, the portion of the semiconductor layer 24 between the drain and source regions functions as a channel region of the TFT.

It will be appreciated that the gate stacks 64 and associated source/drain regions 66, 68 are tailored to the particular type(s) of TFTs to be formed. In some embodiments, the gate stacks include the intrinsic and doped hydrogenated amorphous silicon layers 36, 37 as described above with respect to FIG. 2. Conventional RF-PECVD techniques can be employed to deposit both layers. Gate stacks for other types of TFTs may include high-k gate dielectric layers (not shown) and electrically conductive gate materials on the gate dielectric layers. In one or more embodiments, the gate dielectric comprises a high-dielectric constant (high-k) insulating material, such as, for example, hafnium oxide ($HfO_2$), tantalum oxide ($Ta_2O_5$), or dual-layer silicon dioxide ($SiO_2$)/high-k film. The gate dielectric layer, if employed, may be formed using a deposition technique such as atomic layer deposition (ALD), CVD, sputtering, or the like, although other methods of forming the layer are similarly contemplated. Dielectric spacers (not shown) are formed on the gate stacks.

Each thin film transistor 46 is electrically connected to the indium tin oxide (ITO) electrode 62 by a first metal layer 70. As shown in FIG. 4, the first metal layer 70 includes a portion electrically connecting the source region 68 to the electrode 62. A second portion of the first metal layer is electrically connected to the drain region 66. A first passivation layer 72 is formed on the semiconductor layer 24. A second passivation layer 74 is formed over the first metal layer. A second metal layer 76 extends through the second passivation layer and is electrically connected to the gate structure 64. A third passivation layer 78 is formed over the thin film (driver) transistors 46 and associated metal layers 70, 76. The passivation layers are comprised of electrically insulating materials. Inorganic passivation layers, if employed, may be grown by thermal evaporation, e-beam evaporation or atomic layer deposition; growth methods involving plasma such as PECVD or sputtering may alternatively be used in some embodiments. Examples of inorganic insulators include but are not limited to silicon dioxide, silicon nitride, aluminum oxide, hafnium oxide or combinations thereof. Organic passivation layers, if employed, are typically grown by thermal evaporation or spun from a solution. Examples of organic insulating materials that can be employed for one or more of the passivation layers include but are not limited to parylene, polyimide, polystyrene and polyvinyl alcohol (PVA). In some embodiments, the organic insulating materials may include a photo-sensitizing material to facilitate the patterning of these materials using photolithography. In one example, ammonium dichromate is used as a photo-sensitizer in a PVA solution and applied by spin coating. In some embodiments the third passivation layer 78 may also serve as an edge planarization layer to avoid shorts between the OLED cathode (not shown) and the OLED anode, layer 62 (e.g. ITO). In some embodiments edge planarization may be facilitated by a reflow process which involves low temperature annealing of a polymeric passivation layer after spin-coating and patterning a polymeric passivation layer. The thin-film driver transistor 46 is positioned directly over the transparent, electrically conductive layer 28. In the exemplary structure shown in FIG. 4, the transparent, electrically conductive layer 28 is electrically connected to ground. Alternatively, the transparent, electrically conductive layer 28 can be electrically connected to a reference voltage other than ground. Both options reduce or eliminate parasitic effects of possible electrostatic charge beneath the thin-film transistor.

Figure 5:
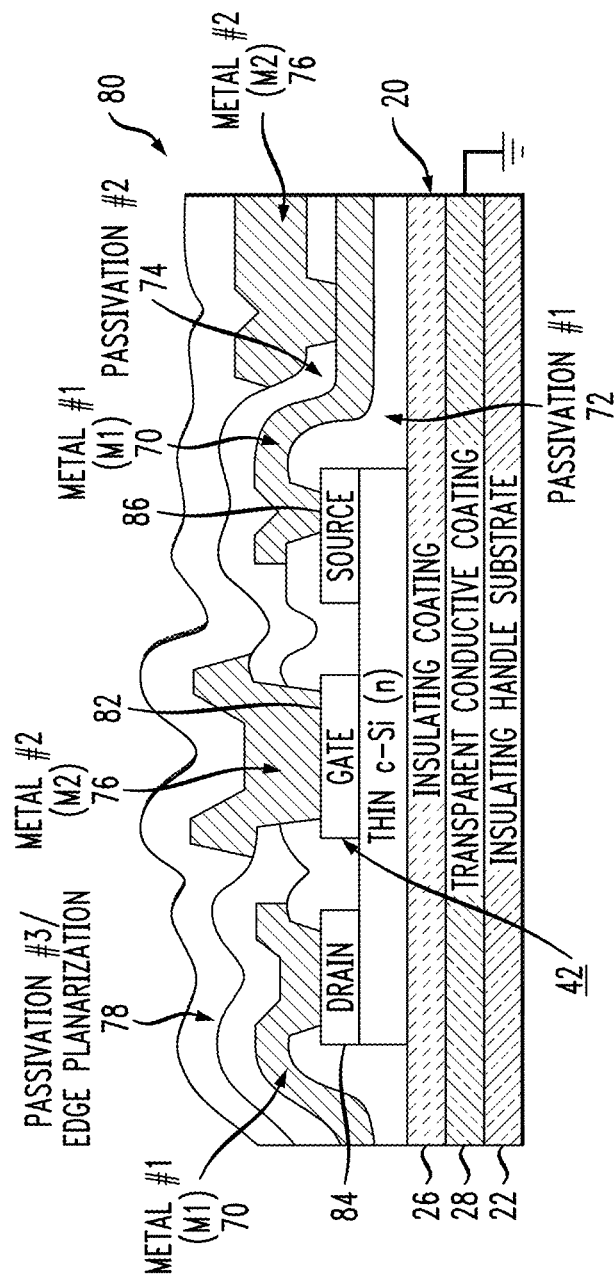
FIG. 5 is a schematic, cross-sectional view depicting an exemplary switching transistor.

A backplane portion 80 including an exemplary switching thin-film transistor 44 is schematically illustrated in FIG. 5. The switching thin-film transistor 44 is formed on the electrically insulating layer 26 using the n-type semiconductor (e.g. c-Si) layer 24. Drain, gate and source regions 84, 82, 86 can be formed on the semiconductor layer 24 using the same process discussed above with respect to the driver transistor 46. The first metal layer 70 is electrically connected to the drain and source regions 84, 86 while the second metal layer 76 is electrically connected to the gate region 82. Passivation layers 72, 74, 78 provide electrical isolation and possibly edge planarization. The passivation layers can be formed using methods such as, but not limited to, CVD, plasma-enhanced CVD (PECVD), spin-on, and other applicable methods known by those skilled in the art. The connection of the transparent electrically conductive layer 28 to ground reduces threshold voltage instability of the switching transistor 44 that may arise due to charge associated with the electrically insulating handle layer 22.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1st Edition, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary fabrication includes obtaining a substrate 20 including an electrically insulating handle layer 22, a semiconductor layer 24, an electrically insulating layer 26 between the semiconductor layer and the handle layer, and an electrically conductive layer 28 between the handle layer and the electrically insulating layer, the electrically conductive layer directly contacting the electrically insulating layer, forming a field-effect transistor (30, 44 or 46) on the semiconductor layer, and forming an electrical connection between the electrically conductive layer 28 and a reference voltage for reducing effects of electrical charges within the handle layer 22 on the field-effect transistor. In some embodiments, the reference voltage is ground, as schematically illustrated in FIGS. 4 and 5. In other embodiments, the reference voltage is voltage bias that can shift the threshold voltage of the transistor(s) formed on the semiconductor layer. A plurality of electrically isolated active regions can be formed from the semiconductor layer followed by forming field-effect transistors on a plurality of the active regions. FIGS. 4 and 5 show two active regions having transistors 46, 44 formed respectively thereon. The electrically conductive layer underlies the entireties of each of the active regions. Accordingly, as shown in FIGS. 4 and 5, no portion of the insulating handle substrate 22 beneath each active region is uncovered by the electrically conductive layer 28. The handle layer 22 and the electrically conductive layer are transparent in one or more embodiments. Exemplary transparent handle layers comprise glass, clear plastic or quartz. Exemplary electrically conductive layers 28 include ITO or AZO.

Further given the above discussion, a semiconductor device is provided that includes a substrate including an electrically insulating handle layer 22, a semiconductor layer 24, an electrically insulating layer 26 between the semiconductor layer and the handle layer, and an electrically conductive layer 28 between the handle layer 22 and the electrically insulating layer 26. One or more field-effect transistors are on the semiconductor layer 24. An electrical connection between the electrically conductive layer 28 and a reference voltage is operative to reduce effects of electrical charges originating with the handle layer on the one or more field-effect transistors. In some embodiments, the semiconductor layer comprises silicon and has a thickness of less than two hundred nanometers. The employment of transparent handle substrates and electrically conductive layers facilitates use of the device in pixel circuits.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this disclosure.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having sensor devices therein formed in accordance with one or more of the exemplary embodiments.

An integrated circuit in accordance with aspects of the present disclosure can be employed in essentially any application and/or electronic system where double-gated field effect transistors would be beneficial. Suitable systems for implementing one or more exemplary embodiments may include, but are not limited to, multiple threshold voltage devices and pixel circuits. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating an electronic device, comprising:
    obtaining a substrate including an electrically insulating handle layer, a semiconductor layer, an electrically insulating layer between the semiconductor layer and the handle layer, and an electrically conductive layer between the handle layer and the electrically insulating layer, the electrically conductive layer directly contacting the electrically insulating layer;
    forming a field-effect transistor including gate, source and drain regions on the semiconductor layer of the substrate and entirely above the electrically conductive layer, and
    forming an electrical connection between the electrically conductive layer and a reference voltage such that the electrically conductive layer is configured to reduce effects of electrical charges on the field-effect transistor originating with the handle layer.

2. The method of claim 1, wherein the reference voltage is ground.

3. The method of claim 1, wherein the handle layer is transparent and obtaining the substrate further includes:
    forming the electrically conductive layer as a transparent coating on the handle layer;

forming the electrically insulating layer on at least one of the electrically conductive layer and the semiconductor layer, and bonding the semiconductor layer to the electrically conductive layer.

4. The method of claim 1, wherein forming the field-effect transistor further includes:

forming the source and drain regions on a top surface of the semiconductor layer;

forming an intrinsic amorphous hydrogenated silicon layer on the top surface of the semiconductor layer between the source and drain regions;

forming a doped amorphous hydrogenated silicon layer on the intrinsic amorphous hydrogenated silicon layer, and forming a metal layer on the doped amorphous hydrogenated silicon layer, the gate region comprising the intrinsic amorphous hydrogenated silicon layer, the doped amorphous hydrogenated silicon layer, and the metal layer.

5. The method of claim 1, wherein the reference voltage is other than ground and operative to adjust the threshold voltage of the field-effect transistor.

6. The method of claim 1, wherein the field-effect transistor is a switching transistor, further including forming a driver transistor on the semiconductor layer electrically connected to the switching transistor.

7. The method of claim 1, further including forming a plurality of electrically isolated active regions from the semiconductor layer and forming field-effect transistors on a plurality of the active regions.

8. The method of claim 7, wherein the electrically conductive layer underlies the entireties of each of the active regions.

9. The method of claim 8, wherein the electrically conductive layer and the handle layer are transparent, the handle layer being comprised of glass, quartz or clear plastic.

10. A semiconductor device, comprising:

a substrate including an electrically insulating handle layer, a semiconductor layer including an electrically isolated active region, an electrically insulating layer between the semiconductor layer and the handle layer, and an electrically conductive layer underlying the entirety of the active region and positioned between the handle layer and the electrically insulating layer;

a field-effect transistor including gate, source and drain regions on the active region of the semiconductor layer of the substrate, and an electrical connection between the electrically conductive layer and a reference voltage operative to reduce effects of electrical charges originating with the handle layer on the field-effect transistor.

11. The semiconductor device of claim 10, wherein the reference voltage is ground.

12. The semiconductor device of claim 10, wherein the handle layer and the electrically conductive layer are transparent.

13. The semiconductor device of claim 12, wherein the electrically conductive layer directly contacts the handle layer and the electrically insulating layer directly contacts the electrically conductive layer and the semiconductor layer, the gate, source and drain regions extend above the semiconductor layer, and a portion of the semiconductor layer between the source and drain regions is functional as a channel region of the field-effect transistor.

14. The method of claim 3, wherein forming the electrically conductive layer includes depositing a transparent, electrically conductive oxide layer as a conformal coating on the handle.

15. The semiconductor device of claim 13, wherein the source and drain regions have a first conductivity type, the gate region includes a doped amorphous hydrogenated silicon layer and an intrinsic amorphous hydrogenated silicon layer, the doped amorphous hydrogenated silicon layer having a second conductivity type opposite to the first conductivity type, the semiconductor layer having the first conductivity type.

16. The semiconductor device of claim 10, further including a second field-effect transistor on the semiconductor layer and a transparent electrode adjoining the electrically insulating layer, the second field-effect transistor being electrically connected to the transparent electrode and configured as a driver transistor, and a passive device electrically connected to the transparent electrode.

17. The semiconductor device of claim 16, wherein the reference voltage is ground.

18. The semiconductor device of claim 16, wherein the semiconductor layer comprises silicon and has a thickness of less than two hundred nanometers.

19. The semiconductor device of claim 16, wherein the electrically conductive layer is selected from the group consisting of indium tin oxide and aluminum-doped zinc oxide and directly contacts the electrically insulating layer.

20. The semiconductor device of claim 19, wherein the source and drain regions have a first conductivity type, the gate region includes a doped amorphous hydrogenated silicon layer and an intrinsic amorphous hydrogenated silicon layer, the doped amorphous hydrogenated silicon layer having a second conductivity type opposite to the first conductivity type, the semiconductor layer having the first conductivity type.

* * * * *